US008884195B2

(12) United States Patent
Wilde

(10) Patent No.: US 8,884,195 B2
(45) Date of Patent: Nov. 11, 2014

(54) HEATING DEVICE, METHOD OF PRODUCING A HEATING DEVICE AND METHOD FOR OPERATING A HEATING DEVICE

(75) Inventor: Eugen Wilde, Knittlingen (DE)

(73) Assignee: E.G.O. Elektro-Gerätebau GmbH, Oberderdingen (DE)

( * ) Notice: Subject to any disclaimer, the term of this patent is extended or adjusted under 35 U.S.C. 154(b) by 319 days.

(21) Appl. No.: 13/315,829

(22) Filed: Dec. 9, 2011

(65) Prior Publication Data

US 2013/0146583 A1 Jun. 13, 2013

(51) Int. Cl.

| | |
|---|---|
| ***H05B 3/68*** | (2006.01) |
| ***H05B 1/00*** | (2006.01) |
| ***H05K 13/00*** | (2006.01) |
| *H05B 3/74* | (2006.01) |

(52) U.S. Cl.

CPC *H05B 3/68* (2013.01); *H05B 3/686* (2013.01); *H05B 3/74* (2013.01)

USPC .................. 219/465.1; 219/460.1; 219/461.1; 219/462.1

(58) Field of Classification Search

CPC .............. H05B 3/68; H05B 3/74; H05B 1/00; H01H 37/48

USPC .......... 219/460.1, 461.1, 467.1, 468.1, 468.2, 219/448.11, 452, 464, 465.1, 466, 518, 621, 219/626, 665; 338/226, 275, 299, 280–281, 338/283–285; 29/592.1

See application file for complete search history.

(56) References Cited

U.S. PATENT DOCUMENTS

| | | | | |
|---|---|---|---|---|
| 1,998,330 | A | | 4/1935 | Nicholson et al. |
| 3,819,903 | A | | 6/1974 | Frick |
| 4,371,780 | A | | 2/1983 | Gössler et al. |
| 4,388,520 | A | | 6/1983 | McWilliams |
| 4,393,299 | A | | 7/1983 | McWilliams |
| 4,633,238 | A | | 12/1986 | Goessler et al. |
| 4,645,911 | A | | 2/1987 | Husslein |
| 4,700,051 | A | | 10/1987 | Goessler et al. |
| 5,051,561 | A | * | 9/1991 | McWilliams et al. ..... 219/461.1 |
| 5,138,135 | A | | 8/1992 | Husslein et al. |
| 5,270,519 | A | * | 12/1993 | Higgins .................. 219/448.19 |

(Continued)

OTHER PUBLICATIONS

U.S. Official Action dated Feb. 28, 2014 in U.S. Appl. No. 13/315,677.

(Continued)

*Primary Examiner* — Henry Yuen
*Assistant Examiner* — Dan T To
(74) *Attorney, Agent, or Firm* — Lee & Hayes, pllc

(57) ABSTRACT

An electrical heating device for a cooking field with a cooking field plate is arranged beneath the cooking field plate and comprises a support, wherein along a rim of said support a rim part in ring form is placed. The heating device comprises a longitudinal heating element for generating heating power for said cooking field to keep food warm that is placed in a saucepan upon it above the heating device. The heating element is arranged in a circumferential groove in said support. In a direction radially inwardly to a central region over the support a gap is provided between the rim part and the support for heating power from said heating element to exit into the central region as a heating of the cooking field plate above the heating device.

22 Claims, 4 Drawing Sheets

(56) References Cited

U.S. PATENT DOCUMENTS

| | | | | |
|---|---|---|---|---|
| 5,448,036 | A * | 9/1995 | Husslein et al. | 219/445.1 |
| 5,498,853 | A | 3/1996 | Gross et al. | |
| 5,517,002 | A * | 5/1996 | Higgins | 219/462.1 |
| 5,977,523 | A * | 11/1999 | Scott | 219/447.1 |
| 6,064,045 | A | 5/2000 | Reichert et al. | |
| 6,211,582 | B1 | 4/2001 | Reimold et al. | |
| 6,765,179 | B2 * | 7/2004 | Wilde et al. | 219/448.19 |
| 7,119,654 | B2 | 10/2006 | Losbichler | |
| 8,344,292 | B2 | 1/2013 | Franca et al. | |
| 2002/0000434 | A1 * | 1/2002 | Morsch et al. | 219/461.1 |
| 2002/0011480 | A1 * | 1/2002 | Schilling et al. | 219/448.11 |
| 2006/0027562 | A1 * | 2/2006 | Toyos et al. | 219/460.1 |
| 2006/0027564 | A1 | 2/2006 | Wilde et al. | |
| 2013/0146582 | A1 | 6/2013 | Wilde | |
| 2013/0146585 | A1 | 6/2013 | Wilde | |

OTHER PUBLICATIONS

U.S. Official Action dated Jun. 24, 2014 in U.S. Appl. No. 13/315,677.

U.S. Official Action dated Sep. 19, 2014 in U.S. Appl. No. 13/315,677.

U.S. Notice of Allowance dated Sep. 11, 2013 in U.S. Appl. No. 13/315,984.

* cited by examiner

HEATING DEVICE, METHOD OF PRODUCING A HEATING DEVICE AND METHOD FOR OPERATING A HEATING DEVICE

CROSS REFERENCE TO RELATED APPLICATIONS

This application is related to:

U.S. patent application Ser. No. 13/315,677, filed on Dec. 9, 2011, entitled "Heating Device, Cooking Field And Method For Operating A Heating Device," and U.S. patent application Ser. No. 13/315,984, filed on Dec. 9, 2011, entitled "Control Device For An Electrical Heating Device For A Cooking Field, Cooking Field And Method For Operating Such An Electrical Heating Device," the contents of both of which are incorporated by reference for all that they teach.

FIELD OF INVENTION

The disclosure generally pertains to an electrical heating device for a cooking field as well as a method for producing such a heating device.

BACKGROUND

It is known from the prior art, for example from U.S. Pat. No. 4,371,780, to provide an electrical heating device in the form of a so-called radiant heater for the use in cooking fields with a cooking field plate made of class ceramic with a high heating power output for cooking food in a saucepan placed on the cooking field plate above said heating device. The heating device is also provided with a second heating element with a much lower heating power output, which can subsequently be used in a food cooking process to keep a meal in the saucepan warm for a duration of 1 or 2 hours or even more. If the heating device is large enough, there may be sufficient space on a support of the heating device for the radiant heater as well as the additional heating element to be arranged together. However, in small heating devices this can become problematic.

SUMMARY

It is an object to provide an electrical heating device as described herein, which can be used not only in a small size, but which also provides a warm-keeping function with a separate heating element that does not need complicated switching devices or cycling devices to maintain a power level that is constant in time for a long duration.

It is a further object to provide an electrical heating device that can be fabricated without major effort compared to conventional heating devices in the form of radiant heaters.

In one embodiment disclosed herein, an electrical heating device for a cooking field with a cooking field plate is provided, wherein the heating device is designed to be arranged beneath the cooking field plate, wherein the heating device includes a support to be arranged parallel to the cooking field plate, and wherein along a rim of the support a rim part in ring form is placed extending upwards. The heating device includes a longitudinal heating element for generating heating power for a function of the cooking field to keep food warm being placed in a saucepan upon the cooking field plate above the heating device, wherein between an underside of the rim part and the support the heating element is arranged, and wherein in a direction inwardly to a region over the support a gap is provided between the rim part and the support in the manner of a sleek window for heating power from the heating element to exit into a region above the support and inside the rim part as a heating of the cooking field plate above the heating device.

In another embodiment disclosed herein, a method for producing a heating device for a cooking field with a cooking field plate is provided, wherein the heating device is designed to be arranged beneath the cooking field plate, wherein the heating device includes a support to be arranged parallel to the cooking field plate, and wherein along a rim of the support a rim part in ring form is placed extending upwards. Further, the heating device includes a longitudinal heating element for generating heating power for a function of the cooking field to keep food warm being placed in a saucepan upon the cooking field plate above the heating device, wherein between an underside of the rim part and the support the heating element is arranged, and wherein in a direction inwardly to a region over the support a gap is provided between the rim part and the support in the manner of a sleek window for heating power from the heating element to exit into a region above the support and inside the rim part as a heating of the cooking field plate above the heating device. The method includes forming a depression in a circumferential rim region of the support, inserting a longitudinal heating element into the depression and positioning the rim part upon the circumferential rim region of the support.

These and further features can be gathered from the claims, description and drawings and the individual features, both singly and in the form of sub combinations, can be implemented in an embodiment of the invention and in other fields and can represent advantageous, independently protectable constructions for which protection is claimed here. The subdivision of the application into individual sections and the subheadings in no way restrict the general validity of the statements made thereunder.

BRIEF DESCRIPTION OF THE DRAWINGS

Exemplary embodiments of the invention are described hereinafter relative to the attached diagrammatic drawings, wherein.

DETAILED DESCRIPTION OF THE EMBODIMENTS

Figure 1:
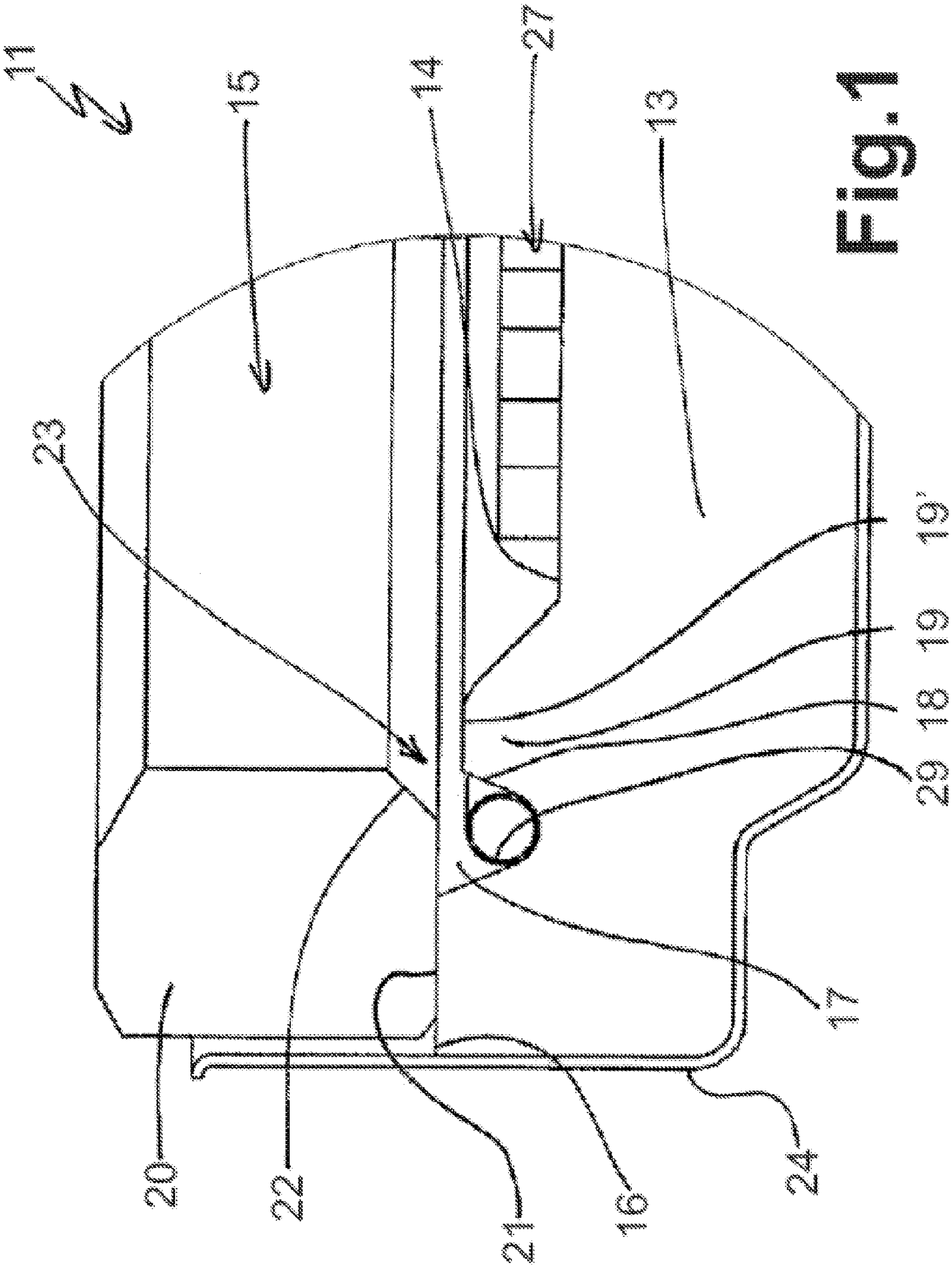
FIG. 1 illustrates an enlarged cross-sectional view through a heating device according to a first embodiment with a heating element between a support and a rim part.

According to one embodiment, a heating device is designed to be arranged beneath the cooking field plate. The heating device comprises a support to be arranged parallel to the cooking field plate, wherein the support can be in the form of a plate or a can. The heating device and the support may be round-circular, which, however, is not mandatory. Along a rim of the support, a rim part is placed standing or extending upwards from the support. The rim part is of ring form, preferably as a single part forming a closed ring. The heating device furthermore, comprises a longitudinal heating element for generating heating power for a function of the cooking field to keep food warm that is placed in a saucepan or the like upon the cooking field plate above the heating device. Preferably, the heating element can be a conventional resistance wire. As a result, the heating element has a rather low heating power output, for example, 80 W up to 150 W for a diameter of 16.5 cm of the heating device. The heating element is arranged or provided between an underside of the rim part and an upper surface of the support. In a direction radial inwardly to a central region over the support, a gap is provided between the rim part and the support or the upper support surface, the gap being formed in the manner of a sleek or narrow window. This gap or sleek window allows heating power from the heating element to exit into the region over the support in a central area and inside the rim part. This heating power can then be used to heat the cooking field plate above the heating device for the function of keeping food warm.

By placing this heating element with low heating power output between the outer rim part and the support surface, a central area of the heating device or its support inside of the rim part can be used with conventional radiant heaters with much higher heating power output. As the heating power output of this additional heating element is rather low, it can be mounted between the rim part and the support without major thermal or mechanical problems. As the rim part is also substantially thermally insulating, if the rim part were to cover the heating element then the heat of the heating element underneath it would not reach the cooking field plate through this rim part.

To solve this problem, a gap between the rim part and the support surface is provided the manner of a sleek, circumferential window, which allows heating power and radiant heating power to be brought into the region over the support inside of the rim part. If this region or air space is heated, it automatically heats the underside of the cooking field plate above it and also a saucepan placed on top of the cooking field plate. The energy efficiency of the operation of the heating element is of minor importance since the power output as mentioned before is only between 50 W or 80 W and 150 W or 200 W.

In one embodiment, there is provided a circumferential depression or a circumferential reception space between an underside of the rim part and said support surface. The heating element is arranged in this depression or reception space. Advantageously, the depression or the reception space is provided in either the rim part or the support.

It is possible to provide the rim part and the support with a distance to each other in a direction radially inwardly to the central region over the support, forming the sleek window mentioned above. Radially outwards of the heating element there should not be any such distance, but the rim part should be placed directly onto the support, possibly with an intermediate layer or an intermediate part, but without any air gap or the like between them.

In one embodiment, the depression or the reception space for the heating element is provided in an outer region of the support surface. An underside of the rim part can be even and level without any depression or the like. This may be advantageous when the material of the support is less stable than the one of the rim part. Furthermore, it is more conventional to provide electrical connections to the heating element through the support, as is the case for conventional radiant heaters. For this, it is easier to provide the heating element in a depression or a reception space in the support itself. Furthermore, if the heating element is mounted into the support and the rim part above it has a beveling on a lower, radially inside edge for enlarging the gap or window into a central region over the support, a direction of radiating heating power from the heating element into this region is already at an angle, which is partly directed to the underside of a cooking field plate for better heating efficiency.

In another embodiment, the depression or reception space can be made in the form of a groove with a constant distance to an outer rim of the support. Furthermore, a cross-section or profile of the groove can also be constant.

Advantageously, the rim part may lie with direct contact on the support in a region radially outside of the heating element. This not only blocks heating energy to escape from where it is intended to be concentrated, but also provides for mechanical stability of the heating device, which is usually pressed against the underside of the cooking field plate by fixing means being attached to an outer rim of the support. In this way, it is furthermore possible to make the surface of the support in a region, which is radially inside of the heating element, lower than the surface of the support radially outside. This lowering of the support surface to a central region forms a part of the sleek gap or window mentioned before. The lowering may be in the size of between 1 millimeter ("mm") and 5 mm or between one third and two thirds of the height of the heating element.

As mentioned before, the rim part can be placed directly upon an outer rim of the support surface. Preferably, the rim part also covers the heating element. Although it may seem advantageous to make the rim part even thinner in radial direction, a certain thickness is mandatory for keeping electrical isolation properties and also mechanical stability as mentioned before. However, it may be provided that the rim part does not overlap the heating element substantially in a direction radially inwards, such that a gap or sleek window can be provided with an energy radiation outlet direction above the horizontal line.

In another embodiment, the depression or reception space has a side or side wall radially inside of the heating element. This side wall can be situated at an oblique angle to the surface of the support, for example, between 85° and 45°. In comparison to a vertical wall, this can also be used to enlarge the gap or window.

For further enlarging the gap or the sleek window between the rim part and the support surface for heating power to exit the reception space with the heating element inside, the rim part can be beveled on a lower, radially inside edge. As the rim part is not placed directly on the support in this area, there is no loss of mechanical stability by such a beveled edge. Also, the electrical isolation thickness of the rim part is not impacted significantly.

In a further embodiment, a central surface of the support can be somewhat lower than the underside of the rim part, for example, as low as the depression or reception space with the heating element inside, or even one or more millimeters lower. The reason for this can be the need for a certain defined distance between the central support surface and an underside of the cooking field plate above it. In this way, the central surface of the support and the depression or reception space for the heating element can be divided by an elevation in the form of a wall, wherein this wall can have oblique-angled sides for better mechanical stability. A radially outer side of said wall can be the inner side of the depression or reception space mentioned before. This wall is mainly for reasons of electrical isolation between the outer heating element and a central surface of the support with radiant heaters or the like. Furthermore, by forming the inner side of the depression or reception space for the heating element there is provided a mechanically reliable fixing of the heating element.

A central area of the support can take up over 50% of the diameter of the support, ranging up to 80%. Preferably, the central area of the support almost reaches to the radially inner side of the rim part.

In a further embodiment, an intermediate layer may be provided between the support and the rim part. This intermediate layer may have a width corresponding to about the width of the rim part. Advantageously, this intermediate layer is mechanically stable and formed as an independent part and inserted between support and rim part. If the intermediate layer is made up of material with good electrically isolating properties, for example mica or ceramic, the disadvantages of placing the heating element radially outside of a conventional radiant heater on the central area of the support surface can be made up for.

For producing such a heating device, a depression or reception space can be made into a circumferential rim region of the support, either by pressing a form into the support or by milling it out. A longitudinal heating element is inserted into this depression, preferably in the form of a long resistance wire in helical spring form. The heating element may be fixed in the depression by staples or similar means, but this need not be required.

After inserting the heating element, the rim part is placed upon the rim region of the support and fixed on it, possibly, via a metal can into which the support has been inserted. As the heating element is fixed inside the depression by being overlapped by the rim part, additional fixing means are not mandatory, if the gap or sleek window is narrower than the diameter of the heating element. Alternatively, before placing the rim part onto the support, an intermediate layer in ring form as described before, may be laid onto the support. Preferably, this takes place without any fixing means, wherein subsequently the rim part is placed upon the intermediate layer as described before and fixed.

For operating the heating device according to the invention in a cooking field with a cooking field plate to keep food in a saucepan warm, the heating element is constantly operated for a duration of more than 10 minutes or 20 minutes, resulting in a temperature of the top surface of said cooking field plate of 100° C. after about 10 minutes. After about 20 minutes, the temperature can be 150° C. For long operation durations of about an hour or more, an end temperature of about 180° C. or 200° C. can be reached.

Turning now to the figures, where further details are provided, FIG. 1 illustrates a sectional view through a heating device 11 shown according to a first embodiment. The heating device 11 may be designed similar as disclosed in U.S. Pat. No. 5,498,853 with a flat support 13 made of thermally insulating and electrically isolating material. Support 13 has a large central surface 14 being flat and taking up about 50% up to 80% of the diameter of the support 13.

Support 13 has an outer rim surface 16, which is elevated in comparison to the central surface 14. Radially inwards of this rim surface 16, a circumferential groove 17 is provided in the form of a V with a widely rounded underside. An inner side 18 of the groove 17 is at an angle of about 70° to the horizontal line.

Between the groove 17 and the central surface 14 there is a separation wall 19. The top surface 19' of the separation wall 19 is about 1 or 2 mm lower than the outer rim surface 16.

A rim part 20, which is formed as a ring and is basically known from the prior art, is placed directly onto the rim surface 16 with its underside 21. Directly above the groove 17, the rim part 20 has a bevelled edge 22 with an angle of about 45° to the horizontal line.

It can be seen from FIG. 1 that there is a gap 23 between the support 13 and the rim part 20 which forms a kind of sleek, circumferential window from the groove 17 radially inwards and directed upwards into a heating region 15. This heating region 15 is formed over the central surface 14 of the support 13 and inside the rim part 20.

On the central surface 14 of the support 13 is placed a conventional radiant heater 27, which can be in the form of a flat metal strip, which is placed upright onto the central surface 14. Such a radiant heater is known for example from U.S. Pat. No. 5,498,853.

Figure 2:
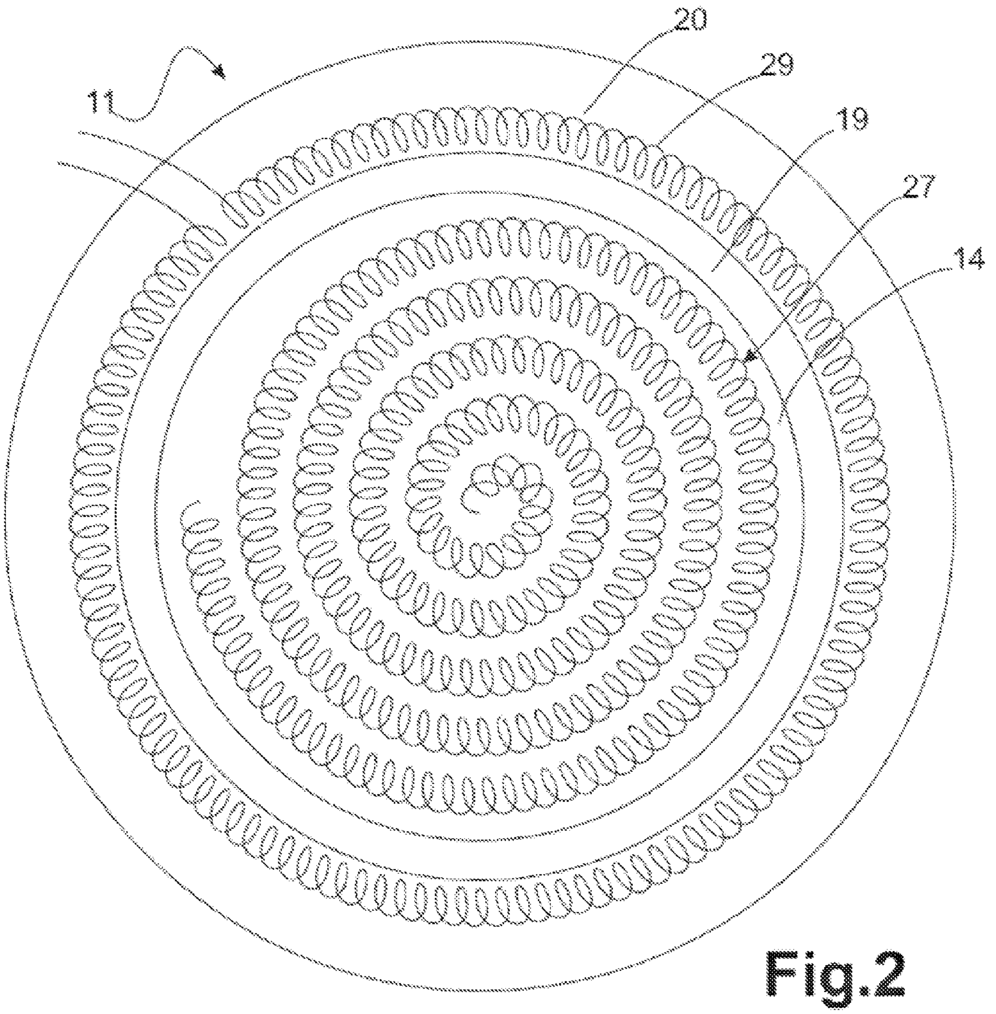
FIG. 2 illustrates a top view onto a heating device according to FIG. 1.

A heating element 29 is arranged in the groove 17 and, as can be observed from FIG. 2, almost forms a complete circle. The heating element 29 can be made from a resistance wire in the form of a long, helical spring, as is known, for example, from U.S. Pat. No. 4,371,780 for a heating element for a similar purpose. Whereas the power output of the main radiant heater 27 can be about 1400 W for a diameter of the heating device 11 of 16.5 cm, the heating output power of the heating element 29 can be in the range of about 100 W.

As can be seen from FIG. 1, most of the heating power from the heating element 29 can exit the space of the groove 17 via the gap 23 into the central heating region 15. Not only radiant heating power can exit this way, but also simply heating the air inside the heating region 15. This heating effect is also explained with regard to the embodiment of FIGS. 3 and 4.

It can be further seen from FIG. 1 that the rim part 20 covers the rim surface 16 of support 13 as well as the width of the groove 17, but does not close it. By providing the bevelled edge 22 and making the inner side 18 of the groove 17 in an oblique angle to the horizontal line, the gap 23 can be changed in its width. However, it should be paid attention to make the gap 23 not wider than the diameter of the heating element 29, so that it securely fixes the heating element 29 in the groove 17. Additional fixing means like staples or the like are not mandatory, but can be provided nevertheless.

It is observed that even without the bevelled edge 22, the gap 23 would be sufficiently large to direct the heating power of the heating element 29 into the central heating region 15. This would allow use of standard rim parts 20 that are also used for heating devices without the additional heating element 29 for a function to keep food warm.

The support 13 and the rim part 20 are placed in a conventional metal can 24. The support 13 can be fabricated by directly pressing raw insulating material into the metal can 24. The rim part 20, that has been fabricated separately, can be fixed by metal tabs cut out from the side rim of the can 24 and bent inside the outside of the rim part 20.

Figure 3:
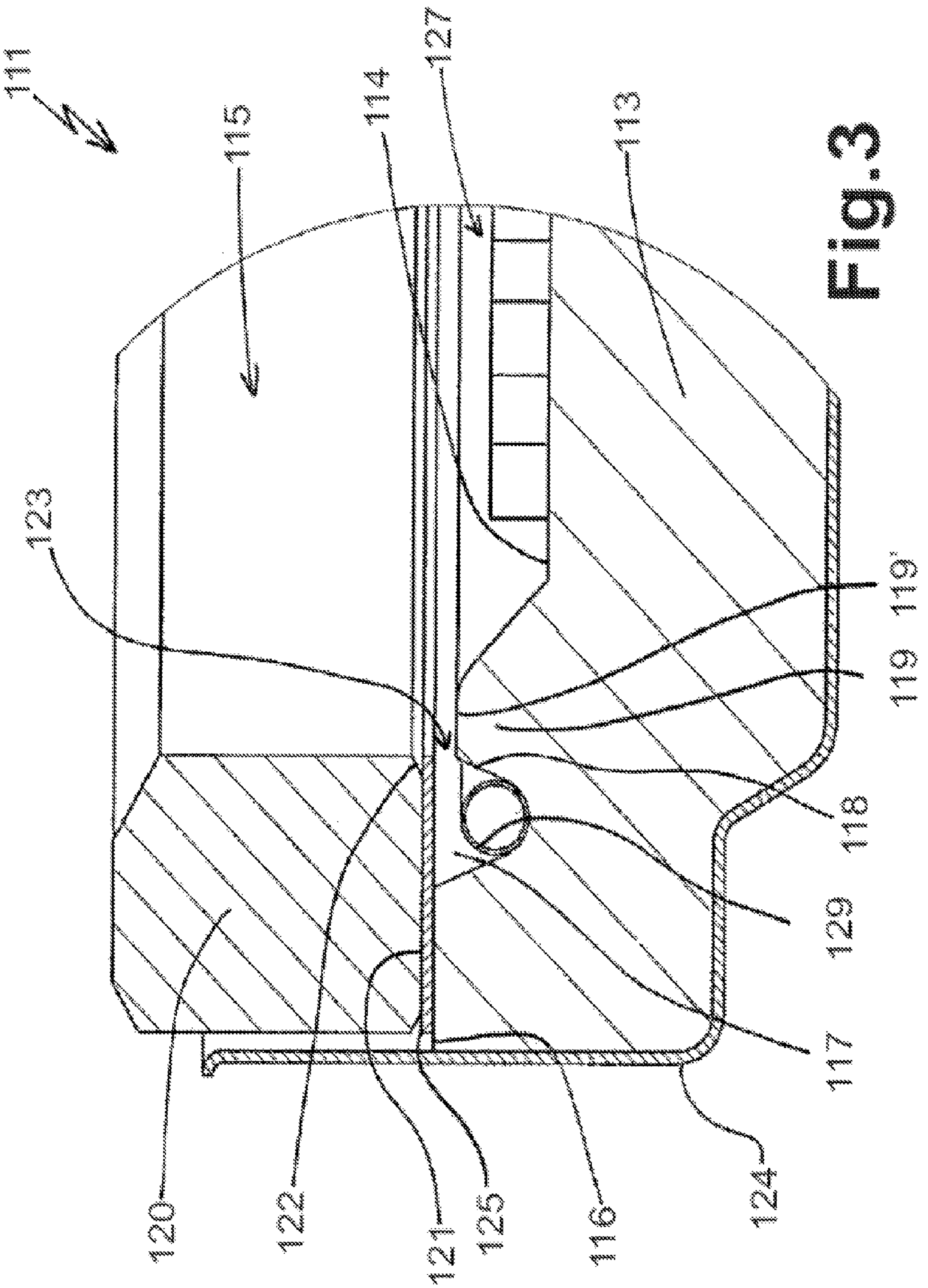
FIG. 3 illustrates a sectional view through a heating device according to a second embodiment with a heating element between a support and a rim part.
Figure 4:
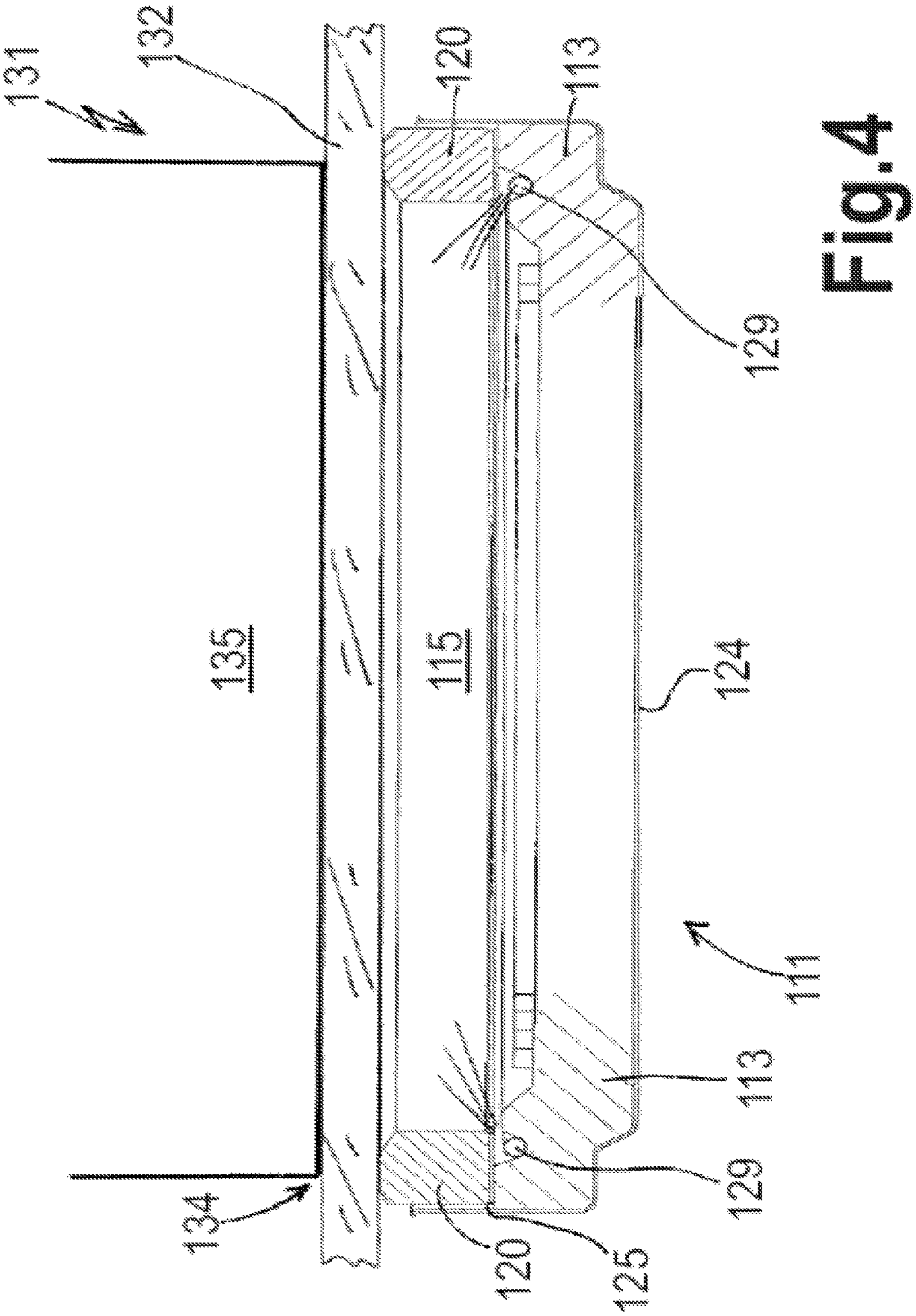
FIG. 4 illustrates a sectional view through a cooking field with a heating device according to FIG. 3 and a saucepan placed above it for keeping food contained therein warm.

In a second embodiment of the invention, a heating device 111 according to FIGS. 3 and 4 is provided. The heating device 111 also has a support 113 with a central surface 114 carrying a main radiant heater 127. The support 113 has an outer rim surface 116 with a groove 117, the groove having an inner side 118 next to a separation wall 119 with a top surface 119'. A heating element 129 is arranged inside the groove 117. Furthermore, the support 113 has a heating region 115 above the central surface 114 and is placed in a metal can 124. This part of the heating device 111 corresponds to the one shown in FIG. 1.

An intermediate ring 125 of mechanically stable, thermally insulating and electrically isolating material is positioned onto the outer rim surface 116. The intermediate ring 125 has about the same width as a rim part 120 placed upon it with an underside 121. An inner edge 122 of the rim part 120 is only slightly bevelled when compared to the one of FIG. 1.

The material of the intermediate ring 125 can be, for example, micanite or any other form of mica. Its thickness can be about 1 or 2 mm. The intermediate ring 125 serves for improvement of an electrical isolation between the heating element 129 and the outside of the heating device 111, especially the metal can 124. The intermediate ring 125 aids in a high voltage testing for safety rules to be kept.

It can be taken from FIG. 3 that a gap 123 that serves as a window for heating power from the heating element 129 to escape the groove 117 into the heating region 115 is much smaller than the one of FIG. 1. However, even such a small gap or sleek window, respectively, is regarded as sufficient for the heating element 129 to heat the heating region 115.

In the cross-sectional view of FIG. 4, a part of a cooking field 131 is shown. The cooking field 131 has a cooking field plate 132, preferably made from conventional glass ceramic. A hot plate 134 is formed above the heating device 111 on the cooking field 131, and a saucepan 135 is placed upon this hot plate 134.

For cooking food in the saucepan 135 with the heating device 111, only the main radiant heater 127 is activated. The main radiant heater 127 reaches temperatures of about 1100° C. with a bright orange glow and the radiant heating power radiates through the cooking field plate 132 into the saucepan 135 or its underside, respectively.

For the function of keeping the food in the saucepan 135 warm, irrespective of whether the heating device 111 has been used for cooking the food or not, only the heating element 129 is activated and switched on. The heating element 129 reaches a temperature of about 300° C. to 600° C., which is significantly less than for the main radiant heater 127, but still enough to heat the heating region 115 sufficiently to generate a temperature on the top surface of the cooking field plate 132 at the hot plate 134 of about 100° C. to 200° C. If the hotplate 134 has been cold before activating the heating element 129, this may take up to 10 or 20 minutes. However, as usually such a process of keeping the food in the saucepan 135 warm not only starts with the saucepan and the food inside being warm, but is intended to last for about one hour up to several hours, this poses no problem for a user.

The invention claimed is:

1. An electrical heating device for a cooking field with a cooking field plate, wherein said heating device is designed to be arranged beneath said cooking field plate, wherein said heating device comprises a support to be arranged parallel to said cooking field plate, wherein along a rim of said support a rim part in ring form is placed extending upwards, wherein said heating device comprises a longitudinal heating element for generating heating power for a function of said cooking field to keep food warm being placed in a saucepan upon said cooking field plate above said heating device, wherein between an underside of said rim part and said support said heating element is arranged, and between an outer rim surface of said support and a separation wall of said support said heating element is arranged, and wherein in a direction inwardly to a region over said support a gap is provided between said rim part and the separation wall of said support in the manner of a narrow window for heating power from said heating element to exit into a region above said support and inside said rim part as a heating of said cooking field plate above said heating device and wherein said rim part substantially covers said heating element and a region of said support radially outside of said heating element.

2. The heating device according to claim 1, wherein a circumferential depression or a circumferential reception space is provided, respectively, between an underside of said rim part and said support, and wherein said heating element is arranged in said circumferential depression or said circumferential reception space.

3. The heating device according to claim 1, wherein in a direction inwardly to said region over said support, said rim part and said support are provided with a distance to each other as said narrow window, and wherein radially outwards of said heating element there is no said distance.

4. The heating device according to claim 2, wherein said circumferential depression or said circumferential reception space for said heating element is provided in an outer region of said support.

5. The heating device according to claim 4, wherein an underside of said rim part is even and level without any depression or the like.

6. The heating device according to claim 2, wherein said circumferential depression or said circumferential reception space is in the form of a groove having constant distance to an outer rim.

7. The heating device according to claim 1, wherein said rim part lies on a region of said support radially outside of said heating element.

8. The heating device according to claim 7, wherein said support in a region radially inside of said heating element has a surface being lower than said surface of said support radially outside of said heating element for said narrow window.

9. The heating device according to claim 8, wherein said surface of said support radially inside said heating element is between 1 mm and 5 mm lower than said support radially outside of said heating element.

10. The heating device according to claim 2, wherein a side wall on an inside of said circumferential depression or said circumferential reception space radially inside of said heating element is situated at an oblique angle to a surface of said support.

11. The heating device according to claim 10, wherein said angle is between 85° and 45° to said surface of said support.

12. The heating device according to claim 1, wherein said rim part is beveled on a lower, radially inside edge for enlarging said window into said inner region of said heating device.

13. The heating device according to claim 2, wherein between said circumferential depression or said circumferential reception space and a central surface of said support an elevation is provided on said support, wherein said elevation forms a radially inner wall of said circumferential depression or said circumferential reception space.

14. The heating device according to claim 1, wherein said central area of said support takes up over 50% and up to 80% of the diameter of the support.

15. The heating device according to claim 1, wherein between said support and said rim part an intermediate layer is provided, said intermediate layer having a width corresponding to about a width of said rim part.

16. The heating device according to claim 15, wherein said intermediate layer is a mechanically stable and independent part.

17. The heating device according to claim 15, wherein said intermediate layer is made up of electrically isolating material.

18. The heating device according to claim 2, wherein said rim part is made from a material different from a material of said support, wherein said rim part material is mechanically more stable and has worse electrically isolating properties than the material of said support.

19. The heating device according to claim 1, wherein said heating element has an electrical power of 50 Watts to 150 Watts.

20. The heating device according to claim 19, wherein on a substantial part of a central surface of said support being surrounded by said rim part a radiant heater is provided with significantly higher heating power output than said heating element.

21. A method for producing a heating device for a cooking field with a cooking field plate, wherein said heating device is designed to be arranged beneath said cooking field plate, wherein said heating device comprises a support to be arranged parallel to said cooking field plate, wherein along a rim of said support a rim part in ring form is placed extending upwards, wherein said heating device comprises a longitudinal heating element for generating heating power for a function of said cooking field to keep food warm being placed in a saucepan upon said cooking field plate above said heating device, wherein between an underside of said rim part and said support said heating element is arranged, and between an outer rim surface of said support and a separation wall of said support said heating element is arranged, wherein in a direction inwardly to a region over said support a gap is provided between said rim part and the separation wall of said support in the manner of a narrow window for heating power from said heating element to exit into a region above said support and inside said rim part as a heating of said cooking field plate above said heating device, and wherein said rim part substantially covers said heating element and a region of said support radially outside of said heating element, the method comprising: forming a depression in a circumferential rim region of said support, said depression formed between the outer rim surface and the separation wall; inserting a longitudinal heating element into said depression; and positioning said rim part upon said circumferential rim region of said support.

22. The method according to claim 21, further comprising: positioning an intermediate layer between said rim part and said outer region of said support, wherein after said intermediate layer is placed onto said support said rim part is positioned onto said intermediate layer.

* * * * *